United States Patent
Yano et al.

(10) Patent No.: US 10,804,186 B2
(45) Date of Patent: Oct. 13, 2020

(54) SEMICONDUCTOR MODULE AND POWER CONVERTER

(71) Applicant: Mitsubishi Electric Corporation, Chiyoda-ku (JP)

(72) Inventors: Shinya Yano, Chiyoda-ku (JP); Yasushi Nakayama, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/605,452

(22) PCT Filed: Jan. 12, 2018

(86) PCT No.: PCT/JP2018/000691
§ 371 (c)(1),
(2) Date: Oct. 15, 2019

(87) PCT Pub. No.: WO2018/207406
PCT Pub. Date: Nov. 15, 2018

(65) Prior Publication Data
US 2020/0266135 A1  Aug. 20, 2020

(30) Foreign Application Priority Data
May 12, 2017  (JP) .................................. 2017-095436

(51) Int. Cl.
*H01L 23/495* (2006.01)
*H02M 7/00* (2006.01)
(Continued)

(52) U.S. Cl.
CPC .... *H01L 23/49575* (2013.01); *H01L 23/3107* (2013.01); *H01L 23/49558* (2013.01);
(Continued)

(58) Field of Classification Search
CPC .............. H01L 23/49575; H01L 23/48; H01L 23/3107; H01L 23/49558; H02M 7/003; H02M 7/48; H02P 27/08
See application file for complete search history.

(56) References Cited

U.S. PATENT DOCUMENTS 8,575,767 B1 * 11/2013 Zommer ............. H01L 23/3135
257/784
9,177,957 B1 * 11/2015 Lee .................... H01L 23/49589
(Continued)

FOREIGN PATENT DOCUMENTS

JP  2007-299781 A  11/2007
JP  2008-306867 A  12/2008
(Continued)

OTHER PUBLICATIONS

International Search Report dated Mar. 27, 2018 in PCT/JP2018/000691 filed Jan. 12, 2018.
(Continued)

*Primary Examiner* — Yusef A Ahmed
(74) *Attorney, Agent, or Firm* — Xsensus LLP

(57) ABSTRACT

Provided are a semiconductor module capable of further increasing an effect of canceling out a parasitic inductance by a current and a power converter including the semiconductor module. The semiconductor module includes a first leadframe, a second leadframe, a third leadframe, an insulating material, a first semiconductor element, and a second semiconductor element. The first leadframe is a plate-shaped wiring path to which a first potential is applied. The second leadframe is a plate-shaped wiring path including an output terminal. The third leadframe is a plate-shaped wiring path to which a second potential is applied. The first semiconductor element is directly joined to the first leadframe with a joint material therebetween, and the second semiconductor element is directly joined to the second leadframe with a (Continued)

joint material therebetween. The first leadframe and the second leadframe face each other with the insulating material therebetween.

10 Claims, 9 Drawing Sheets

(51) Int. Cl.
    *H01L 23/31*     (2006.01)
    *H02P 27/08*     (2006.01)
    *H02M 7/5387*     (2007.01)

(52) U.S. Cl.
    CPC ........ H02M 7/003 (2013.01); *H02M 7/53871* (2013.01); *H02P 27/08* (2013.01)

(56) References Cited

U.S. PATENT DOCUMENTS

| | | | | |
|---|---|---|---|---|
| 2005/0285238 | A1* | 12/2005 | Joshi | H01L 23/49575 257/673 |
| 2007/0252169 | A1* | 11/2007 | Tokuyama | H01G 4/224 257/162 |
| 2010/0165577 | A1 | 7/2010 | Tokuyama et al. | |
| 2012/0008280 | A1 | 1/2012 | Tokuyama et al. | |
| 2012/0058681 | A1* | 3/2012 | Suzuki | H01L 23/49861 439/656 |
| 2014/0116751 | A1 | 5/2014 | Hatori | |
| 2014/0233204 | A1 | 8/2014 | Tokuyama et al. | |
| 2015/0206830 | A1* | 7/2015 | Takada | H01L 24/92 257/676 |
| 2016/0233204 | A1* | 8/2016 | Funatsu | H01L 23/49537 |
| 2017/0025337 | A1* | 1/2017 | Padmanabhan | H10L 24/48 |
| 2017/0338190 | A1 | 11/2017 | Fujino et al. | |
| 2018/0047649 | A1* | 2/2018 | Bando | H01L 29/0688 |
| 2018/0122720 | A1* | 5/2018 | Hable | H01L 24/48 |
| 2018/0240740 | A1* | 8/2018 | Tu | H01L 21/76898 |
| 2020/0066686 | A1* | 2/2020 | Mohn | H01L 25/072 |

FOREIGN PATENT DOCUMENTS

| | | |
|---|---|---|
| JP | 2012-54449 A | 3/2012 |
| JP | 2013-118336 A | 6/2013 |
| JP | 2013-219290 A | 10/2013 |
| JP | 2014-90115 A | 5/2014 |
| WO | WO 2016/136457 A1 | 9/2016 |

OTHER PUBLICATIONS

Notice of Reasons for Refusal dated Mar. 5, 2019 in Japanese Patent Application No. 2018-561071 (with English language translation), citing documents AO and AP therein, 8 Pages.

\* cited by examiner

SEMICONDUCTOR MODULE AND POWER CONVERTER

TECHNICAL FIELD

The present invention relates to a semiconductor module and a power converter.

BACKGROUND ART

Semiconductor modules for use in power converters have recently been required to have a lower loss. The method of increasing the switching speed of a semiconductor element included in the semiconductor module is used in order to reduce a loss. A high parasitic inductance of a circuit, however, increases surge voltage and noise in switching, which may hinder the switching speed from increasing.

Thus, reducing parasitic inductance is a critical challenge for such semiconductor modules, and various techniques have been developed. For example, Japanese Patent Laying-Open No. 2013-118336 (PTL 1) and Japanese Patent Laying-Open No. 2008-306867 (PTL 2) disclose a configuration in which a loop-shaped current path is formed, and the magnetic fluxes occurring in the opposing portions of the loop-shaped path are directed opposite to each other to cancel out inductance components.

CITATION LIST

Patent Literature

PTL 1: Japanese Patent Laying-Open No. 2013-118336
PTL 2: Japanese Patent Laying-Open No. 2008-306867

SUMMARY OF INVENTION

Technical Problem

In order to reduce parasitic inductance, it is an effective way of causing a conductor, which serves as a current path and to which a positive DC potential is applied, and another conductor, which serves as a current path and to which a negative DC potential is applied, to face each other such that currents flow through these conductors in opposite direction, thereby canceling out the magnetic fluxes as described in Japanese Patent Laying-Open No. 2013-118336. In Japanese Patent Laying-Open No. 2013-118336, though a conductor for obtaining output also faces the conductors provided for obtaining positive and negative DC potentials, a current does not flow through the conductor including an output terminal in a direction opposite to the current of the conductors for positive and negative DC potentials, which does not produce an effect of reducing parasitic inductance by opposite current. Also in Japanese Patent Laying-Open No. 2013-118336, the current path is formed of a wire conceivably having a large parasitic inductance, so that the effect of reducing parasitic inductance may not be achieved sufficiently.

In Japanese Patent Laying-Open No. 2008-306867, though the current path is formed of a conductor plate, a terminal is interposed between the current path and the semiconductor element, and the current path is connected to the terminal with a fixing member such as a screw. Consequently, the parasitic inductance in the interposed portion such as the terminal or the like may not be eliminated.

The present invention has been made in view of the above problem, and has an object to provide a semiconductor module capable of further increasing the effect of canceling out a parasitic inductance by current, and a power converter including the semiconductor module.

Solution to Problem

A semiconductor module according to the present invention includes a first leadframe, a second leadframe, a third leadframe, an insulating material, a first semiconductor element, and a second semiconductor element. The first leadframe is a plate-shaped wiring path to which a first potential is applied. The second leadframe is a plate-shaped wiring path including an output terminal. The third leadframe is a plate-shaped wiring path to which a second potential is applied. The insulating material seals the first and second leadframes to integrate the first and second leadframes with each other. The first semiconductor element is directly joined to the first leadframe with a joint material therebetween. The second semiconductor element is directly joined to the second leadframe with a joint material therebetween. The first leadframe and the second leadframe face each other with the insulating material therebetween.

Advantageous Effects of Invention

According to the present invention, the wiring path is formed as a plate-shaped leadframe, and the leadframe and the semiconductor element are directly joined to each other with the joint material therebetween. This can further increase the effect of canceling out a parasitic inductance by current.

DESCRIPTION OF EMBODIMENTS

Embodiments of the present invention will be described below with reference to the drawings. For the sake of convenience, an X-direction, a Y-direction, and a Z-direction are introduced.

Embodiment 1

Figure 1:
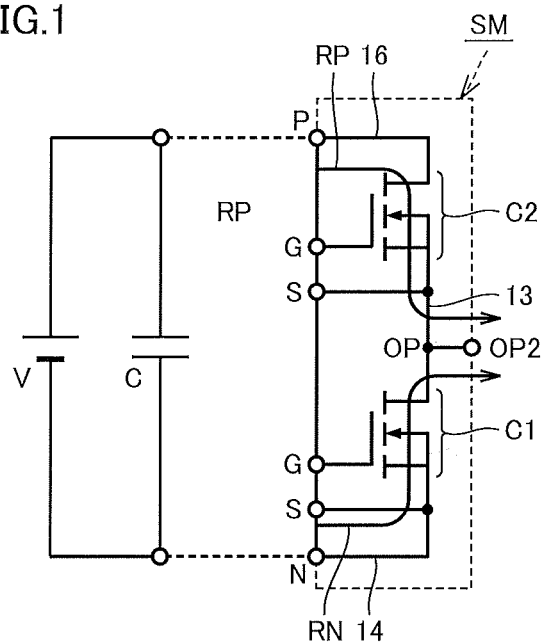
FIG. 1 is a circuit diagram showing a circuit configuration of a semiconductor module in each example of Embodiment 1.
Figure 2:
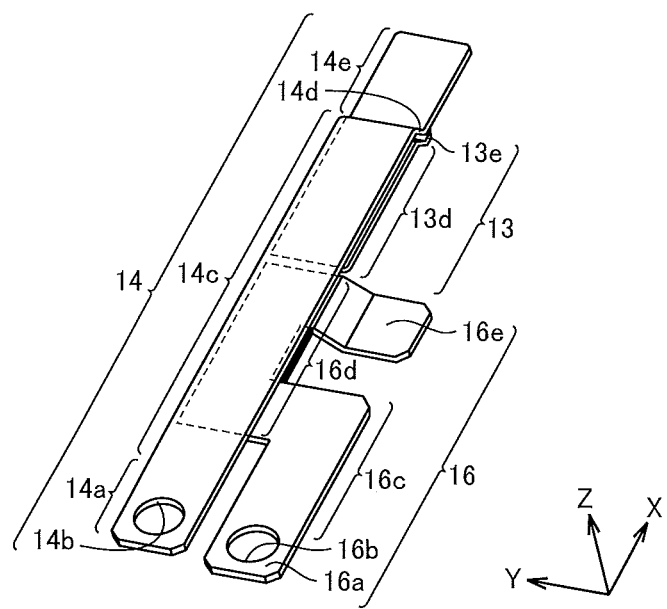
FIG. 2 is a schematic perspective view showing, in a simplified manner, a first example of part of a configuration in which actual members of the semiconductor module shown in the circuit diagram of FIG. 1 are disposed.

FIG. 1 shows a circuit configuration of a semiconductor module SM in each example of Embodiment 1. FIG. 2 shows a first example of a mode in which only some of members constituting semiconductor module SM shown in the circuit diagram of FIG. 1 are extracted. First, the first example of the present embodiment will be described.

Referring to FIG. 1, semiconductor module SM in each example of the present embodiment is used in an inverter circuit or a step-up/step-down converter circuit. Semiconductor module SM mainly includes a first leadframe 14, a second leadframe 13, a third leadframe 16, a first semiconductor element C1, and a second semiconductor element C2. First leadframe 14 is connected to, for example, the negative side of a DC power supply V, so that a DC potential, which is a first potential, is applied to first leadframe 14. Third leadframe 16 is connected to, for example, the positive side of DC power supply V, so that a positive DC potential, which is a second potential different from the first potential, is applied to third leadframe 16. That is to say, in semiconductor module SM, second leadframe 13 is connected to be sandwiched between first leadframe 14 and third leadframe 16. In semiconductor module SM in the circuit diagram shown in FIG. 1, first semiconductor element C1 is connected to first leadframe 14 and second leadframe 13 to be interposed therebetween, and second semiconductor element C2 is connected between third leadframe 16 and second leadframe 13 to be interposed therebetween. A smoothing capacitor C external to semiconductor module SM is electrically connected between a terminal N of FIG. 1, to which the first potential of first leadframe 14 is applied, and a terminal P of FIG. 1, to which the second potential of third leadframe 16 is applied. Terminal N and terminal P are a first end and a second end, respectively, at which each leadframe and its corresponding semiconductor element are connected in series as described above. First leadframe 14 is also electrically connected to the negative side of smoothing capacitor C provided externally. Third leadframe 16 is electrically connected to the positive side of smoothing capacitor C provided externally. Second leadframe 13 includes output terminals as a terminal OP and a terminal OP2 in FIG. 1 and is connected to, for example, an external motor or the like in FIG. 1.

In FIG. 1, two semiconductor elements, namely, one first semiconductor element C1 and one second semiconductor element C2, are disposed in a portion serving as semiconductor module SM which is surrounded by the dotted line, and there is provided a single path alone running from first semiconductor element C1 and second semiconductor element C2 to second leadframe 13. Thus, semiconductor module SM shown in the circuit diagram of FIG. 1 has a so-called 2 in 1 structure, and semiconductor module SM of the present embodiment corresponds to an amount of one phase of an inverter or a converter. That is to say, if semiconductor module SM is used in a three-phase inverter for driving a motor, three semiconductor modules SM each of which is surrounded by the dotted line in the circuit of FIG. 1 are connected in parallel, second leadframes 13 each connected to a corresponding one of the three semiconductor modules SM are provided, and each of the three second leadframes 13 is connected to a corresponding one phase of the motor. This can increase the electric capacitance of, for example, the inverter composed of a plurality of, for example, three semiconductor modules SM connected in parallel.

Although first semiconductor element C1 and second semiconductor element C2 used herein are preferably metal oxide semiconductor field effect transistors (MOSFETs), the present invention is not limited thereto. For example, these semiconductor elements may be rectifying devices such as insulated gate bipolar transistors (IGBTs) or diodes. Alternatively, these semiconductor elements may be configured as an appropriate combination of a MOSFET and an IGBT or a diode. First semiconductor element C constitutes a lower arm, and second semiconductor element C2 constitutes an upper arm.

The MOSFET in the present embodiment has a configuration in which a gate G and a source S are provided as control electrodes, as shown in FIG. 1. Alternatively, the MOSFET in the present embodiment may have a temperature sensing diode electrode for detecting the temperatures of semiconductor chips of first semiconductor element C1 and second semiconductor element C2, or a current sensing electrode for detecting the currents flowing through the semiconductor chips as the control electrodes, in addition to gate G and source S. Although not shown, each control electrode of the MOSFET is electrically connected to a control terminal by a metal wire made of aluminum, copper, gold or the like and is connected to a control substrate at the control terminal. Although not shown, the control substrate serves to output a signal for turning on and off, for example, the MOSFETs serving as first semiconductor element C1 and second semiconductor element C2. The control substrate may be provided inside or outside the semiconductor module.

The current path of first semiconductor element C1 often does not pass through smoothing capacitor C. For example, in the circuit configuration including a plurality of, for example, three semiconductor modules SM connected in parallel, when first semiconductor element C1 is a MOSFET, a current passed from the source S side toward the drain of the MOSFET does not flow through smoothing capacitor C and flows from semiconductor module SM of another phase which is connected in parallel.

In view of the above, in FIG. 1, a portion between smoothing capacitor C and terminal N and a portion between smoothing capacitor and terminal P are indicated by the dotted lines, and the starting points of a current path RN and a current path RP are located at terminal P and terminal N. In actuality, however, smoothing capacitor C is connected with terminal P and terminal N in the dotted portions of FIG. 1.

Referring to FIG. 2, first leadframe 14 is a plate-shaped wiring path having a planar shape extending along the XY plane in which first leadframe 14 runs approximately longer in the X-direction in its entirety, has a width substantially constant in the Y-direction, and has a thickness in the Z-direction. First leadframe 14 includes a first terminal portion 14a, a first terminal hole 14b, a first longer extending portion 14c, a first bent portion 14d, and a first shorter extending portion 14e. Specifically, first terminal portion 14a is a region at the end on one side in the X-direction, that is, on the negative side of FIG. 2. First terminal hole 14b is a through-hole formed in first terminal portion 14a and passing through first terminal portion 14a in the Z-direction. First longer extending portion 14c is a central portion of first leadframe 14 and is a region running longest straight in the X-direction. First bent portion 14d is a region bent to run downward in the Z-direction while running from first longer extending portion 14c toward the positive side in the X-direction. First shorter extending portion 14e is a region running from first bent portion 14d further in the X-direction to be shorter than first longer extending portion 14c. First terminal portion 14a is disposed in the region closest to the negative side in the X-direction of first longer extending portion 14c, and first longer extending portion 14c is disposed to be adjacent to the positive side in the X-direction of first terminal portion 14a.

Second leadframe 13 is divided into two members, and only one of these members is shown in FIG. 2. Second leadframe 13 shown in FIG. 2 has a planar shape extending approximately along the XY plane in its entirety, and has a second facing portion 13d and a second electrical connection 13e. Second facing portion 13d is a region in which second leadframe 13 overlaps first leadframe 14 in plan view, that is, faces first leadframe 14. Second facing portion 13d runs in the X-direction and overlaps first longer extending portion 14c of first leadframe 14 such that the main surfaces thereof face each other. Second facing portion 13d faces first longer extending portion 14c to be disposed below first longer extending portion 14c in the Z-direction. Herein, second facing portion 13d includes a region bent to run downward in the Z-direction while running toward the positive side in the X-direction. This is because the region bent to run downward in the Z-direction runs to substantially face first bent portion 14d of first leadframe 14. Second electrical connection 13e is a region running along the XY plane in the X-direction from a region of second facing portion 13d on the positive side in the X-direction, which runs downward in the Z-direction. However, second electrical connection 13e has a narrow range. The other member of two members constituting second leadframe 13, which differs from one member, will be described below.

Third leadframe 16 has bent portions, the direction of extension of which is changed by about 90°, at three locations in the XY-direction, and thus has a portion running in the X-direction and portions running in the Y-direction. However, third leadframe 16 is a plate-shaped wiring path having a planar shape extending along the XY plane in which third headframe 16 runs longer in the X-direction in its entirety, has a width approximately constant in the direction crossing the direction of its running, and has a thickness in the Z-direction. Third leadframe 16 includes a third terminal portion 16a, a third terminal hole 16b, a third longer extending portion 16c, a third facing portion 16d, and a third electrical connection 16e. Third terminal portion 16a is a region at the end on one side in the X-direction, that is, on the negative side of FIG. 2. Third terminal hole 16b is a through-hole formed in third terminal portion 16a and passing through third terminal portion 16a in the Z-direction. Third longer extending portion 16c is a region disposed to be adjacent to first terminal portion 14a on the positive side in the X-direction and runs in the X-direction substantially parallel to first longer extending portion 14c with a spacing from first longer extending portion 14c. Third longer extending portion 16c includes a region included in the region bent therefrom and running in the Y-direction, which does not overlap first leadframe 14 in plan view. Third facing portion 16d is a region in which third leadframe 16 overlaps first leadframe 14 in plan view, that is, faces first leadframe 14. Third facing portion 16d runs in the X-direction and overlaps first longer extending portion 14c of first leadframe 14 such that the main surfaces thereof face each other. Third facing portion 16d faces first longer extending portion 14c to be disposed below first longer extending portion 14c in the Z-direction. Third electrical connection 16e is a region which runs in the Y-direction from third facing portion 16d on the positive side in the X-direction and does not overlap first leadframe 14. Thus, third leadframe 16 is basically smaller than first leadframe 14 in the dimension in the X-direction and greater than first leadframe 14 in the dimension in the Y-direction. Third terminal portion 16a is disposed in the region closest to the negative side in the X-direction of third longer extending portion 16c and is included in third longer extending portion 16c.

As described above, in the present embodiment, first leadframe 14 and second leadframe 13 face each other, and third leadframe 16 and first leadframe 14 face each other. Although the portions at which the leadframes face each other run in the X-direction, also in the other regions, each leadframe of the semiconductor module in the first example of the present embodiment basically runs in the X-direction.

Figure 3:
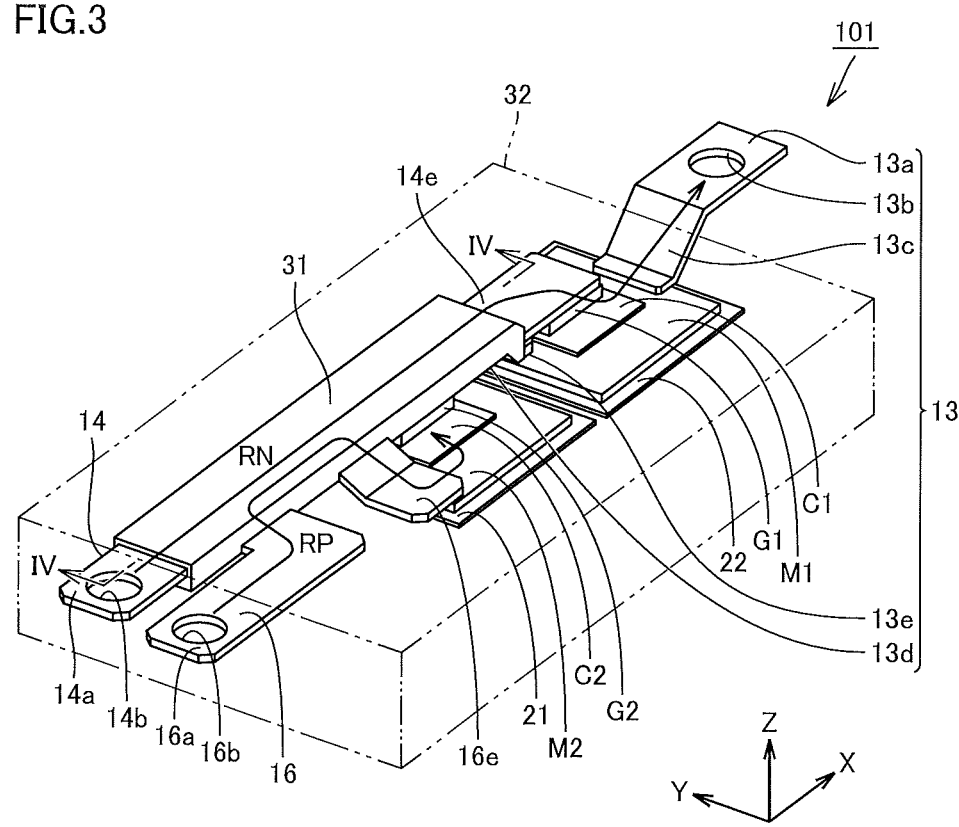
FIG. 3 is a schematic perspective view showing, in more detail than in FIG. 2, the first example of the configuration in which the actual members of the semiconductor module shown in the circuit diagram of FIG. 1 are disposed.

FIG. 3 shows a first example showing in detail the members constituting semiconductor module SM in the circuit diagram of FIG. 1 such that a larger number of members are included than in FIG. 2. Referring to FIGS. 2 and 3, in a semiconductor module 101 of the first example which is indicated by semiconductor module SM, the other member of the two members constituting second leadframe 13, which differs from one member, includes a second terminal portion 13a, a second terminal hole 13b, and a second bent portion 13c. Specifically, second terminal portion 13a is a region at the end on one side in the X-direction, that is, on the positive side in FIG. 3. Second terminal hole 13b is a through-hole formed in second terminal portion 13a and passing through second terminal portion 13a in the Z-direction. Second bent portion 13c is a region bent to run downward in the Z-direction while running from second terminal portion 13a toward the negative side in the X-direction, and also includes a region running along the XY plane at the end thereof closest to the negative side in the X-direction. Second leadframe 13 is a plate-shaped wiring path having a planar shape in which both of one member and the other member have a thickness in the Z-direction and extend approximately along the XY plane.

A ceramic plate 21 and a ceramic plate 22, which have, for example, a rectangular plate shape, are provided to electrically insulate a main circuit constituting semiconductor module 101 in the first example of the present embodiment from the outside thereof. A metal pattern M1 having, for example, a rectangular shape is formed on the upper surface of ceramic plate 22 in the Z-direction, and chip-shaped first semiconductor element C1 is connected to the upper surface of metal pattern M1 in the Z-direction with solder, silver, or the like. Similarly, a metal pattern M2 having, for example, a rectangular shape is formed on the upper surface of ceramic plate 21 in the Z-direction, and chip-shaped second semiconductor element C2 is connected to the upper surface of metal pattern M2 in the Z-direction with solder, silver, or the like. The solder or silver connecting semiconductor elements C1 and C2 and metal pattern M1 and M2 may include, for example, a metal piece for improving heat dissipation and relieving stress. Although not shown, a metal pattern for stress adjustment may also be formed on the lower surfaces of ceramic plates 21 and 22 in the Z-direction. The metal patterns on the lower surfaces of ceramic plates 21 and 22 in the Z-direction are bonded to a cooler external to the semiconductor module with grease, insulating sheet, solder, or the like. The metal patterns on the lower surfaces of ceramic plates 21 and 22 in the Z-direction dissipate the heat generated in first semiconductor element C1, second semiconductor element C2, or metal patterns M1 and M2 to the outside of semiconductor module 101.

In a modification, in order to electrically insulate the main circuit constituting semiconductor module 101 from the outside thereof, the following mechanism may be used in place of a mechanism that provides ceramic plate 21 in semiconductor module 101. That is to say, an insulating sheet may be provided in place of ceramic plate 21 in semiconductor module 101. Alternatively, a mechanism may be provided that electrically insulates a main circuit, which constitutes semiconductor module 101 not inside but outside semiconductor module 101, from the outside thereof.

First leadframe 14, two second leadframes 13, and third leadframe 16 are each made of a metal material such as copper or aluminum. The cross section of each leadframe, which crosses the direction of its running, has a relatively small sectional area which would not pose a problem of heat generation by current.

Referring to and comparing semiconductor module SM in the circuit diagram of FIG. 1 and semiconductor module 101 in the first example of the present embodiment of FIG. 3, first shorter extending portion 14e located at the end on the positive side in the X-direction of first leadframe 14 and first semiconductor element C1 are directly joined to each other with a joint material G1 therebetween. Consequently, first leadframe 14 and first semiconductor element C1 are electrically connected to each other. First terminal portion 14a on the negative side in the X-direction of first leadframe 14 is electrically connected to smoothing capacitor C by screwing with first terminal hole 14b serving as a screw hole.

Second facing portion 13d of one member of the two members of second leadframe 13, which is located on the negative side in the X-direction, and second semiconductor element C2 are directly joined to each other with a joint material G2 therebetween. Consequently, second leadframe 13 and second semiconductor element C2 are electrically connected to each other. Second electrical connection 13e of one member of the two members of second leadframe 13, which is located on the positive side in the X-direction, is electrically connected to metal pattern M1 joined to the lower side of first semiconductor element C1 in the Z-direction by a connection method A described below. The MOSFET serving as first semiconductor element C1 is a vertical device and has an electrode on the rear surface of the chip thereof. That is to say, metal pattern M1 and first semiconductor element C1 are electrically connected to each other, so that second electrical connection 13e of second leadframe 13 is electrically connected to first semiconductor element C1. The terminal of one member of the two members of second leadframe 13 corresponds to terminal OP in FIG. 1.

The end of second bent portion 13c of the other member of the two members of second leadframe 13, which is located on the negative side in the X-direction, is electrically connected to metal pattern M1 joined to the lower side of first semiconductor element C1 in the Z-direction by connection method A. Consequently, second bent portion 13c is electrically connected to first semiconductor element C1. Second terminal portion 13a of the other member of the two embers of second leadframe 13, which is located on the positive side in the X-direction, is connected to the external motor or the like, for example, by screwing with second terminal hole 13b serving as a screw hole. The terminal of the other member of the two members of second leadframe 13 corresponds to terminal OP2 in FIG. 1.

Third electrical connection 16e of third leadframe 16 which is located on the positive side in the X-direction is electrically connected to metal pattern M2 joined to the lower side of second semiconductor element C2 in the Z-direction by connection method A. The MOSFET serving as second semiconductor element C2 is a vertical device and has an electrode on the rear surface of the chip thereof. In other words, metal pattern M2 and second semiconductor element C2 are electrically connected to each other, so that third electrical connection 16e of third leadframe 16 is electrically connected to second semiconductor element C2. Third terminal portion 16a of third leadframe 16 which is located on the negative side in the X-direction is electrically connected to smoothing capacitor C, for example, by screwing with third terminal hole 16b serving as a screw hole.

Although joint materials G1 and G2 are preferably solder, for example, these joint materials may be silver. Joint materials G1 and G2 may include, for example, a metal piece for improving heat dissipation and relieving stress.

Although connection method A above may provide connection, for example, by joint materials G1 and G2 such as solder or silver, another method may be used that provides connection using an ultrasonic joining step or any other step.

Although screwing using first terminal hole 14b, second terminal hole 13b, and third terminal hole 16b may be performed in the connection of smoothing capacitor with the terminal or the motor, first terminal hole 14b, second terminal hole 13b, and third terminal hole 16b may be welded with the terminal of the smoothing capacitor or the motor.

Since third facing portion 16d is disposed below first longer extending portion 14c in the Z-direction, first terminal hole 14b of first leadframe 14 and third terminal hole 16b of third leadframe 16 differ from each other in the height in the Z-direction, and first terminal hole 14b is located above third terminal hole 16b. Alternatively, first leadframe 14 and second leadframe 16 may be disposed to be equal in height in the Z-direction by bending any one of these leadframes.

Figure 4:
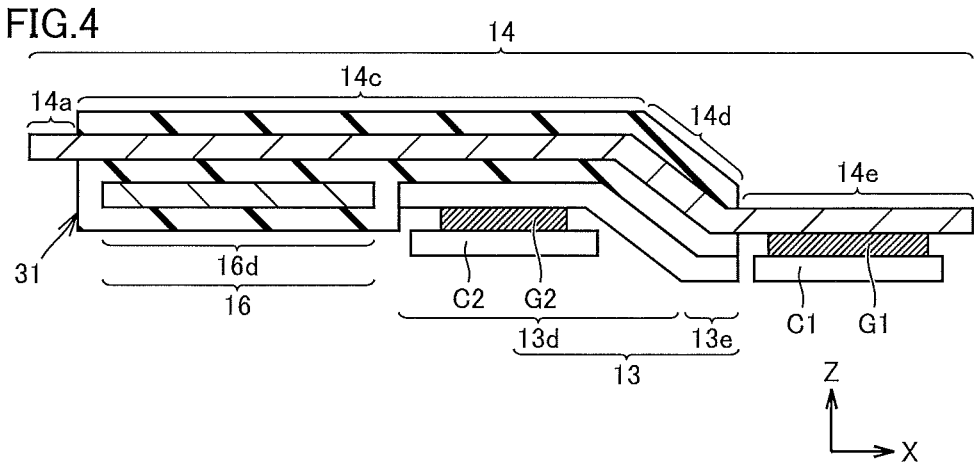
FIG. 4 is a schematic sectional view taken along the line IV-IV in FIG. 3.

FIG. 4 is a schematic sectional view of a portion at which, particularly, first leadframe 14 overlaps second leadframe 13 and third leadframe 16 of FIG. 3 to face each other in a planar manner as viewed in plan view. Referring to FIGS. 3 and 4, first leadframe 14 and second leadframe 13 are sealed with insulating material 31 to be integrated with each other. At the same time, third leadframe 16 is also sealed with insulating material 31 to be integrated with first leadframe 14 and second leadframe 13.

First leadframe 14 and second leadframe 13 face each other with insulating material 31 therebetween, and third leadframe 16 faces first leadframe 14 with insulating material 31 therebetween. In other words, insulating material 31 covers first leadframe 14, second leadframe 13, and third leadframe 16 so as to wrap the outside surfaces thereof, and is arranged to be sandwiched between first leadframe 14 and second leadframe 13 facing each other and between first leadframe 14 and third leadframe 16 facing each other. Insulating material 31 is formed such that a portion thereof covering the outside surfaces of first leadframe 14 and the like and another portion thereof sandwiched between first leadframe 14 and second leadframe 13 are integrated with each other.

Insulating material 31 according to the present embodiment is preferably, for example, a resin material. In particular, insulating material 31 is preferably a resin material having a melting point higher than the melting point of the solder. Specifically, insulating material 31 is preferably a liquid crystal polymer.

First leadframe 14 and second leadframe 13 are preferably formed such that the portions thereof, which are soldered with joint materials G1 and G2, are exposed from insulating material 31. In other words, as shown in FIG. 4, as second leadframe 13 is viewed from the lower surface side in the Z-direction, the region in which second leadframe 13 is joined to second semiconductor element C2 with joint material G2 is not covered with but is exposed from insulating material 31, and the region in which first leadframe 14 is joined to first semiconductor element C1 with joint material G1 is not covered with but is exposed from insulating material 31.

The spacing between first leadframe 14 and second leadframe 13 facing each other and the spacing between first leadframe 14 and third leadframe 16 facing each other are preferably a minimum spacing which would cause no problem in the insulating function of insulating material 31 as a resin. Causing no problem herein means not only that a dielectric breakdown does not occur during the dielectric voltage test in shipping of a product but also that a dielectric breakdown does not occur even after a long-term use.

Although not shown in FIG. 3, a hole for fixing a jig and a projecting shape for positioning, which are used in the formation of a resin as insulating material 31 in each leadframe, may be formed. That is to say, a hole, which is provided to pass through first leadframe 14 from the upper surface to the lower surface thereof in the Z-direction, may be provided in first leadframe 14 to fix first leadframe 14 to the jig. Alternatively, a projecting shape may be formed on, for example, the surface of a partial region of first leadframe 14.

As shown in FIG. 3, semiconductor module 101 further includes a sealing material 32 sealing at least part of leadframe 14, at least part of leadframe 13, at least part of leadframe 16, insulating material 31, first semiconductor element C1, and second semiconductor element C2. Sealing material 32 covers all components (i.e., including ceramic plates 21 and 22 and the like) to seal these components excluding first terminal portion 14a of first leadframe 14, second terminal portion 13a of second leadframe 13, and third terminal portion 16a of third leadframe 16. Semiconductor module 101 preferably includes, as sealing material 32, a material different from the liquid crystal polymer used in insulating material 31. Specifically, sealing material 32 is preferably a silicon gel.

The function and effect of semiconductor module 101 in the first example of the present embodiment will now be described while describing a current path during driving with reference to FIGS. 1 and 3.

A current path during driving will be described first. Referring to FIGS. 1 and 3, when a positive current is output, two types of current paths are conceivable during driving of semiconductor module 101: current path RN through which a current flows from smoothing capacitor C toward first leadframe 14 and then flows into second leadframe 13, and current path RP through which a current flows from smoothing capacitor C toward third leadframe 16 and then flows into second leadframe 13. Although FIGS. 1 and 3 show current path RN and current path RP together for the sake of convenience, these current paths cannot be formed simultaneously.

Current path RN indicated by the arrow in FIG. 1 corresponds to current path RN indicated by the arrow in FIG. 3. In current path RN, a current flows from first terminal portion 14a of first leadframe 14 through first longer extending portion 14c to first shorter extending portion 14e, and therefrom, reaches first semiconductor element C1 which is directly joined to first shorter extending portion 14e with joint material G1 therebetween. A current flows from first semiconductor element C1 to metal pattern M1 immediately therebelow, and reaches second terminal portion 13a through second bent portion 13c that corresponds to terminal OP2 of second leadframe 13. This drives the external motor or the like which is connected to second terminal portion 13a.

Current path RP indicated by the arrow in FIG. 1 corresponds to current path RP indicated by the arrow in FIG. 3. In current path RP, a current flows from third terminal portion 16a of third leadframe 16 through third longer extending portion 16c and third facing portion 16d to third electrical connection 16e, and reaches metal pattern M2. A current flows from metal pattern M2 to second semiconductor element C2 immediately thereabove, and therefrom, flows through joint material G2 to second facing portion 13d that corresponds to terminal OP of second leadframe 13. Once the current flows from second facing portion 13d through second electrical connection 13e to metal pattern M1, thereafter, the current reaches second terminal portion 13a through second bent portion 13c that corresponds to terminal OP2 of second leadframe 13, as in current path RN. This drives the external motor or the like connected to second terminal portion 13a.

That is to say, both of current paths RN and RP in FIG. 1 are paths through which a current flows in approximately the same direction in semiconductor module 101 of FIG. 3, namely, from the negative side to the positive side in the X-direction. First longer extending portion 14c of first leadframe 14 which is included in current path RN and third facing portion 16d of third leadframe 16 which is included in current path RP overlap to face each other. Also, first longer extending portion 14c of first leadframe 14 which is included in current path RN and second facing portion 13d of second leadframe 13 overlap to face each other.

Thus, the following case is considered here, where the MOSFET included in first semiconductor element C1 is turned off to cause a current to flow opposite to current path RN of FIG. 1, and the MOSFET included in second semiconductor element C2 is turned on by switching. In this case, the current through current path RN in the direction shown in FIG. 1 decreases, and as a result of the decrease in current, the magnetic flux around current path RN decreases. At this time, a current begins to flow through current path RP, and a result of the increase in current, the magnetic flux around current path RP increases. Since first leadframe 14 and third leadframe 16 have opposite directions in which the current changes, total changes in magnetic flux can be canceled out, thus reducing the occurrence of parasitic inductance due to the changes in magnetic flux at a portion at which the plurality of leadframes overlap to face each other. Since the occurrence of parasitic inductance is reduced, surge voltage and noise can be reduced in switching, thus increasing a switching speed. This eliminates the need for taking a measure to restrain a parasitic inductance, for example, increasing the thickness or width of the leadframe, which is contrary to miniaturization of semiconductor module 101. The application of the present embodiment can thus reduce both the size of and loss in semiconductor module 101.

In contrast, also when a current flows from terminal OP2 into the leadframe side, first leadframe 14 and third leadframe 16 have opposite directions in which current changes. This achieves the effect of reducing magnetic flux to cancel out the total changes in magnetic flux, thus reducing parasitic inductance as in the above case.

As described above, in semiconductor module 101, since first leadframe 14 and part of second leadframe 13 face each other with insulating material 31 therebetween so as not to cause a short circuit, thus increasing the effect of restraining the occurrence of a parasitic inductance during switching. This is because only insulating material 31 is sandwiched between the two leadframes, and the reduced distance therebetween can reduce a current loop formed of current path RN and current path RP, so that a mutual inductance during switching can be used effectively. Similarly, in semiconductor module 101, first leadframe 14 and part of third leadframe 16 face each other with insulating material 31 therebetween so as not to cause a short circuit, thus increasing the effect of restraining the occurrence of surge voltage or the like during switching which is caused by a parasitic inductance.

In the present embodiment, first leadframe 14 and first semiconductor element C1 are directly joined to each other with joint material G1 therebetween, and second leadframe 13 and second semiconductor element C2 are directly joined to each other with joint material G2 therebetween. This can reduce a current loop by an amount by which no terminal or the like is sandwiched between the leadframe and the semiconductor element to reduce parasitic inductance.

In the present embodiment, the current path is formed of a plate-shaped leadframe. This can reduce a parasitic inductance more than when, for example, the current path is formed of a wire which conceivably has a high parasitic inductance.

In semiconductor module 101, first leadframe 14, second leadframe 13, and third leadframe 16 are sealed with insulating material 31 to be integrated with each other. Consequently, the leadframes can be disposed to be integrated with each other in the reflow step included in the manufacturing process. Thus, compared with the case in which the leadframes are disposed separately, the leadframes can be attached easily during assembly, thus leading to improved assembly.

In addition, in semiconductor module 101, solder is used as joint materials G1 and G2, a resin material is used as insulating material 31, and insulating material 31 is a resin material having a melting point higher than that of solder, such as liquid crystal polymer. Consequently, insulating material 31 does not melt in the reflow step, leading to easy solder joining of the members in the reflow step.

Sealing material 32 sealing the entirety is made of a material different from insulating material 31, leading to improved design flexibility of each leadframe. For example, sealing material 32, which is made of silicon gel, is capable of sealing without a die.

Figure 5:
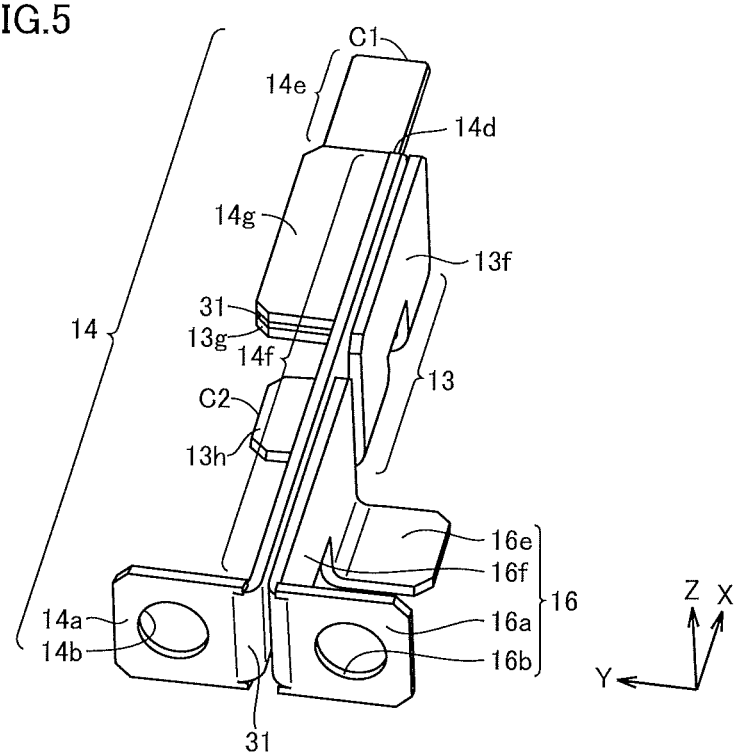
FIG. 5 is a schematic perspective view showing, in a simplified manner, a second example of part of the configuration in which the actual members of the semiconductor module shown in the circuit diagram of FIG. 1 are disposed.
Figure 6:
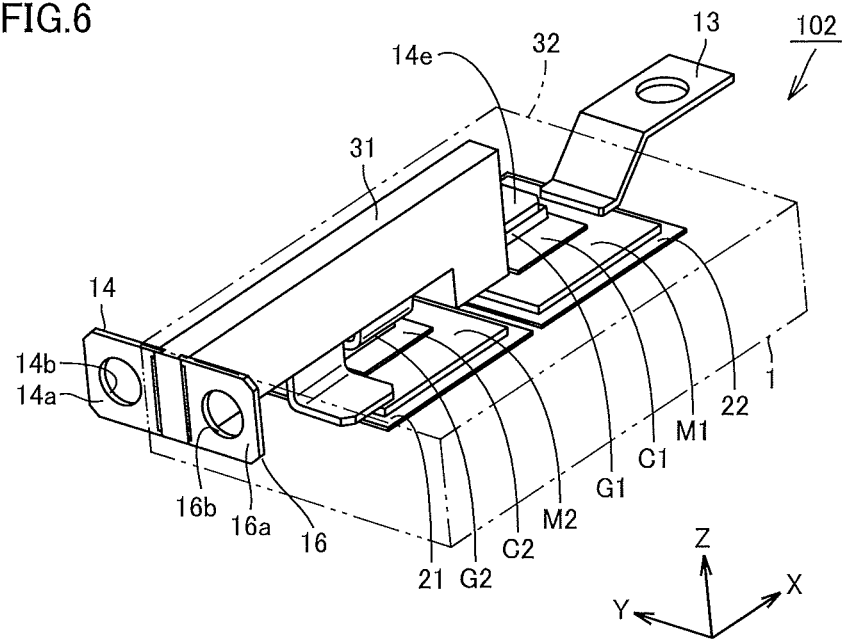
FIG. 6 is a schematic perspective view showing, in more detail than in FIG. 5, the second example of the configuration in which the actual members of the semiconductor module shown in the circuit diagram of FIG. 1 are disposed.

A second example of the present embodiment will be described below. FIG. 5 shows a second example of a state in which only some of the members constituting semiconductor module SM shown in the circuit diagram of FIG. 1 are extracted. FIG. 6 shows the second example showing the members constituting semiconductor module SM shown in the circuit diagram of FIG. 1 such that a larger number of members are provided than in FIG. 5. Referring to FIGS. 5 and 6, a semiconductor module 102 in the second example of the present embodiment basically has components similar to those of semiconductor module 101 in the first example, and accordingly, the same components are denoted by the same references and will not be described repeatedly. However, semiconductor module 102 differs from semiconductor module 101 in the shape of each leadframe, which will be described below.

First leadframe 14 shown in FIG. 5 includes first terminal portion 14a, first terminal hole 14b, a first vertically-longer extending portion 14f, a first horizontally-longer extending portion 14g, first bent portion 14d, and first shorter extending portion 14e. That is to say, the portion corresponding to first longer extending portion 14c which extends along the XY plane and runs in the X-direction in semiconductor module 101 is replaced with first vertically-longer extending portion 14f in semiconductor module 102. First vertically-longer extending portion 14f has a planar shape extending along the XZ plane in which first vertically-longer extending portion 14f runs longer in the X-direction, has an approximately constant width in the Z-direction, and has a thickness in the Y-direction. First terminal portion 14a is formed to be bent from the end on the negative side in the X-direction of first vertically-longer extending portion 14f and extends along the YZ plane. In contrast, first horizontally-longer extending portion 14g is disposed on the positive side in the Y-direction of first vertically-longer extending portion 14f and has a planar shape extending along the XY plane as in first longer extending portion 14c of semiconductor module 101. First shorter extending portion 14e runs in the X-direction from the end on the positive side in the X-direction of first horizontally-longer extending portion 14g with first bent portion 14d therebetween as in semiconductor module 101. First leadframe 14 of semiconductor module 102 differs in the above respect from first leadframe 14 of semiconductor module 101 having a planar shape extending approximately along the XY plane in its entirety.

A first member of second leadframe 13 shown in FIG. 5 has a second vertically facing portion 13f, a second horizontally-longer extending portion 13g, and a second horizontally-shorter extending portion 13h. That is to say, the portion corresponding to second facing portion 13d which extends along the XY plane and runs in the X-direction in semiconductor module 101 is replaced with second vertically facing portion 13f in semiconductor module 102. Second vertically facing portion 13f extends along the XZ plane, and second horizontally-longer extending portion 13g and second horizontally-shorter extending portion 13h extend along the XY plane. Second horizontally-longer extending portion 13g is disposed directly below first horizontally-longer extending portion 14g to overlap first horizontally-longer extending portion 14g. Both of second horizontally-longer extending portion 13g and second horizontally-shorter extending portion 13h are spaced from each other in the X-direction on the positive side in the Y-direction of second vertically facing portion 13f. The first member of second leadframe 13 of semiconductor module 102 differs in the above respect from the first member of second leadframe 13 of semiconductor module 101 having a planar shape extending approximately along the XY plane in its entirety.

Third leadframe 16 shown in FIG. 5 includes third terminal portion 16a, third terminal hole 16b, a third vertically facing portion 16f, and third electrical connection 16e. That is to say, the portion corresponding to third facing portion 16d which extends along the XY plane and runs in the X-direction in semiconductor module 101 is replaced with third vertically facing portion 16f in semiconductor module 102. Third vertically facing portion 16f extends along the XZ plane, and third electrical connection 16e extends along the XY plane. Third electrical connection 16e is disposed on the negative side in the Y-direction of third vertically facing portion 16f. Third terminal portion 16a is formed to be bent from the end on the negative side in the X-direction of third vertically facing portion 16f and extends along the YZ plane. Third leadframe 16 of semiconductor module 102 differs in the above respect from third leadframe 16 of semiconductor module 101 having a planar shape extending appropriately along the XY plane in its entirety.

In semiconductor module 102, thus, first vertically-longer extending portion 14f and second vertically facing portion 13f overlap each other such that the main surfaces thereof face each other. In semiconductor module 102, first vertically-longer extending portion 14f and third vertically facing portion 16f overlap each other such that the main surfaces thereof face each other.

Insulating material 31 is sandwiched between first vertically-longer extending portion 14f and second vertically facing portion 13f and between first vertically-longer extending portion 14f and third vertically facing portion 16f. Insulating material 31 is also sandwiched between first horizontally-longer extending portion 14g and second horizontally-longer extending portion 13g. Although FIG. 5 shows as described above, in actuality, insulating material 31 covers the members and seals the members to integrate the members with each other as shown in FIG. 6.

Referring to and comparing semiconductor module SM in the circuit diagram of FIG. 1 and semiconductor module 102 of FIGS. 5 and 6, in semiconductor module 102, first shorter extending portion 14e at the end on the positive side in the X-direction of first leadframe 14 and first semiconductor element C1 are directly joined to each other with joint material G1 therebetween. Second horizontally-shorter extending portion 13h of the first member of second leadframe 13 and second semiconductor element C2 are directly joined to each other with joint material G2 therebetween. Second horizontally-longer extending portion 13g and metal pattern M1 are electrically connected to each other, so that second horizontally-longer extending portion 13g and first semiconductor element C1 are electrically connected to each other. Since the other connections are similar to those of semiconductor module 101 described above, detailed description thereof will be omitted. As described above, semiconductor module 102 is connected so as to constitute the circuit of semiconductor module SM of FIG. 1.

The function and effect of semiconductor module 102 in the second example of the present embodiment will now be described. Semiconductor module 102 achieves the following function and effect in addition to the effect of reducing parasitic inductance as in semiconductor module 101.

As in semiconductor module 102, the portions of first leadframe 14 and second leadframe 13 which face each other are disposed to extend in the XZ-direction that is the vertical direction, so that an area occupied by those portions can be made smaller in plan view than when these portions extend in the XY-direction as in semiconductor module 101. Consequently, the entire semiconductor module 102 can be miniaturized further.

First terminal portion 14a and third terminal portion 16a are provided to extend in the YZ-direction as in semiconductor module 102, so that the direction in which a screw used in these portions can be the X-direction. Although the direction in which the screw used in these portions runs is the Z-direction because first terminal portion 14a and the like extend in, for example, the XY-direction in semiconductor module 101, in this case, these portions cannot be screwed unless the height of first leadframe 14 in the Z-direction is sufficiently greater than the height of the screw, and besides, a nut cannot be disposed. However, the configuration of semiconductor module 102 can avoid the above problem. Also in the case where another terminal is welded to first terminal portion 14a, the other terminal can be disposed in the X-direction, conveniently facilitating a welding operation.

Figure 7:
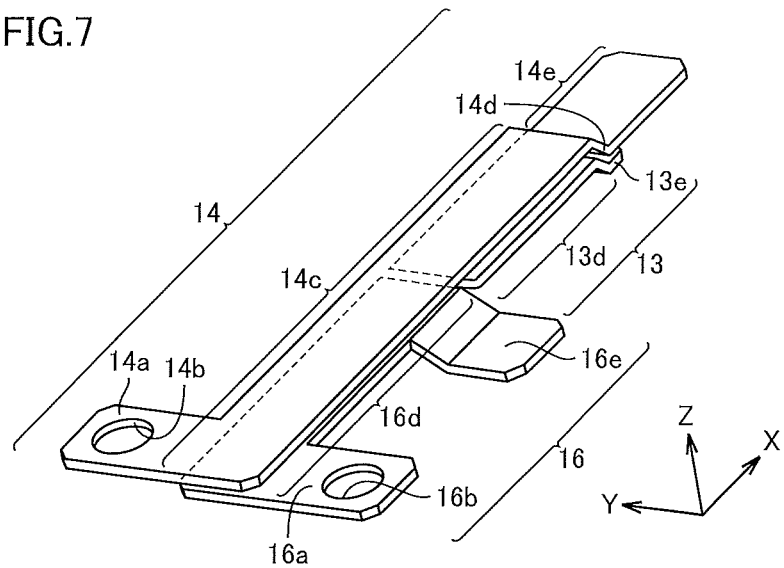
FIG. 7 is a schematic perspective view showing, in a simplified manner, a third example of part of the configuration in which the actual members of the semiconductor module shown in the circuit diagram of FIG. 1 are disposed.
Figure 8:
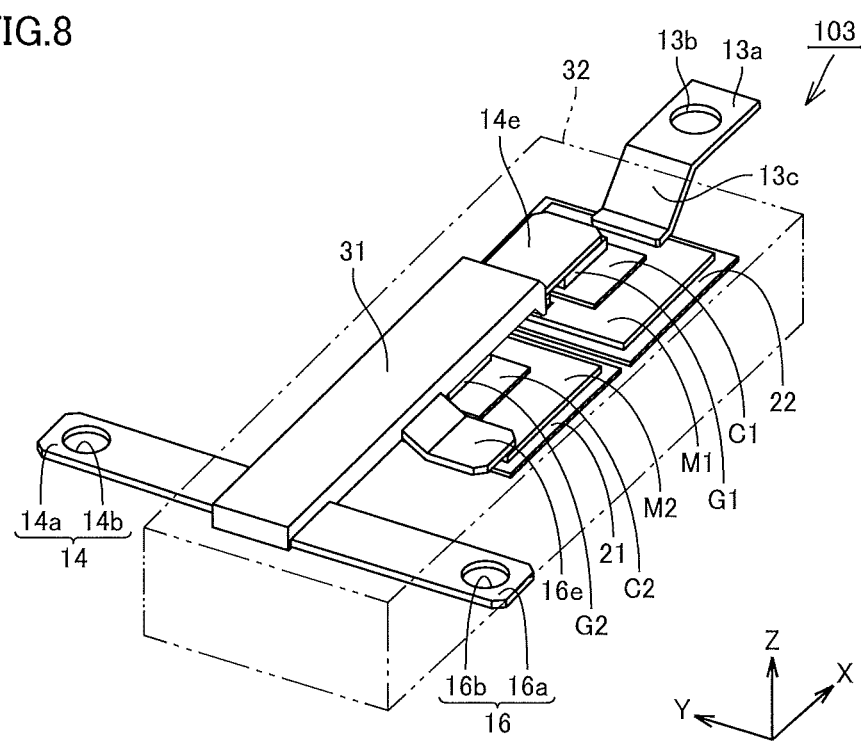
FIG. 8 is a schematic perspective view showing, in more detail than in FIG. 7, the third example of the configuration in which the actual members of the semiconductor module shown in the circuit diagram of FIG. 1 are disposed.

A third example of the present embodiment will now be described. FIG. 7 shows a third example in which only some of the members constituting semiconductor module SM shown in the circuit diagram of FIG. 1 are extracted. FIG. 8 shows the third example showing in detail the members constituting semiconductor module SM shown in the circuit diagram of FIG. 1 such that a larger number of members are provided than in FIG. 7. Referring to FIGS. 7 and 8, since a semiconductor module 103 in the third example of the present embodiment basically has components similar to those of semiconductor module 101 in the first example, the same components are denoted by the same references, and description thereof will not be repeated. However, semiconductor module 103 differs from semiconductor module 101 in the shape of each leadframe, which will be described below.

Each leadframe of semiconductor module 103 shown in FIG. 7 has a planar shape extending approximately along the XY plane in its entirety, similarly to each leadframe of semiconductor module 101 shown in FIG. 2. In FIG. 7, however, first leadframe 14 has a bent shape such that first terminal portion 14a runs in the Y-direction crossing the X-direction in which first longer extending portion 14c runs. In FIG. 7, also, third leadframe 16 has a bent shape such that third terminal portion 16a runs in the Y-direction crossing the X-direction in which third facing portion 16d runs. First terminal portion 14a runs from first longer extending portion 14c toward the positive side in the Y-direction, whereas third terminal portion 16a runs from third facing portion 16d toward the negative side in the Y-direction. First terminal portion 14a and third terminal portion 16a thus run in the opposite directions. Herein, thus, first terminal portion 14a is a region running while being bent toward the positive side in the Y-direction from the end that is closest to the positive side in the Y-direction of first longer extending portion 14c in the Y-direction, and third terminal portion 16a is a region running while being bent toward the positive side in the Y-direction from the end that is closest to the negative side in the Y-direction of third facing portion 16d in the Y-direction. That is to say, first terminal portion 14a and third terminal portion 16a do not overlap first longer extending portion 14c and third facing portion 16d.

Since the electrical connection of each leadframe with a corresponding one of first semiconductor element C1 and second semiconductor element C2 in semiconductor module 103 is similar to that of semiconductor module 101, description thereof will be omitted.

The function and effect of semiconductor module 103 in the third example of the present embodiment will now be described. Semiconductor module 103 achieves the following function and effect in addition to the effect of reducing parasitic inductance as in semiconductor module 101.

In comparison between FIGS. 7 and 2, forming first leadframe 14 and third leadframe 16 as in semiconductor module 103 replaces the portion corresponding to third longer extending portion 16c of third leadframe 16 of semiconductor module 101 with third facing portion 16d. That is to say, third facing portion 16d runs to the end on the negative side in the X-direction of first leadframe 14 in semiconductor module 103. Semiconductor module 103 thus has a larger area of third facing portion 16d in which third leadframe 16 faces first leadframe 14 than semiconductor module 101. Consequently, semiconductor module 103 can have a more enhanced effect of restraining parasitic inductance than semiconductor module 101.

Embodiment 2

Figure 9:
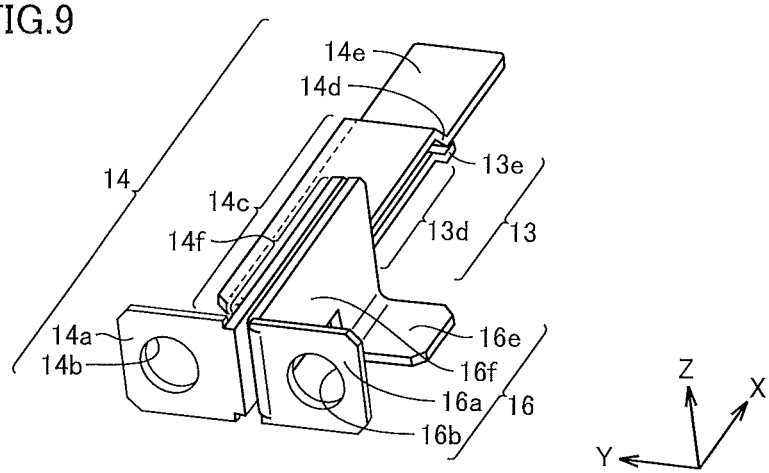
FIG. 9 is a schematic perspective view showing, in a simplified manner, an example of part of a configuration in Embodiment 2 in which the actual members of the semiconductor module shown in the circuit diagram of FIG. 1 are disposed.
Figure 10:
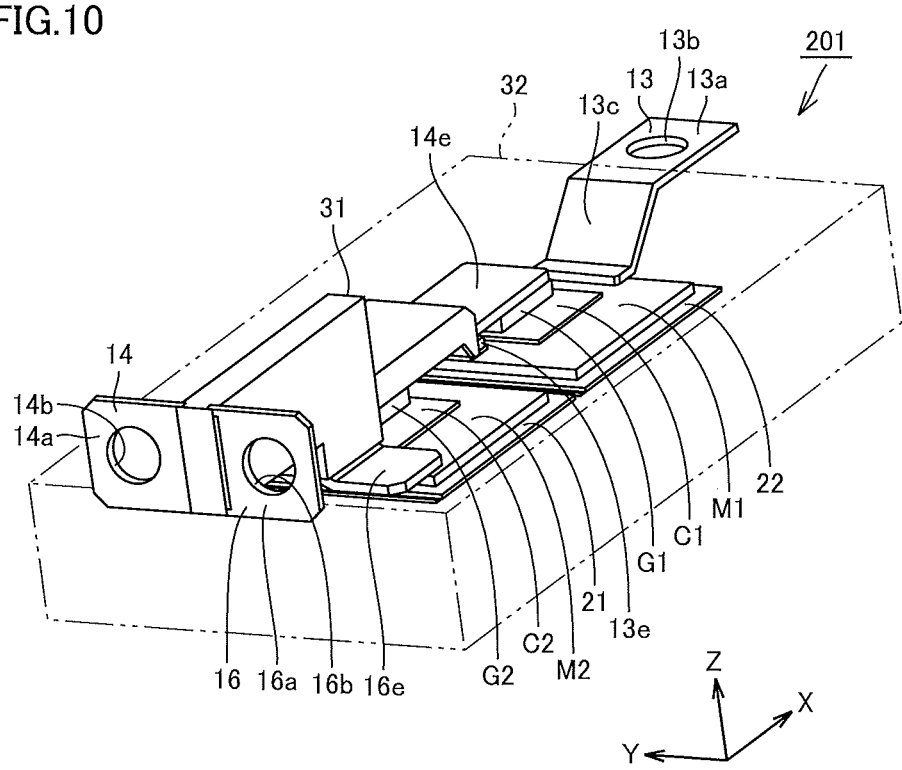
FIG. 10 is a schematic perspective view showing, in more detail than in FIG. 9, the example of Embodiment 2 of the configuration in which the actual members of the semiconductor module shown in the circuit diagram of FIG. 1 are disposed.

FIG. 9 shows a state in which only some of the members constituting semiconductor module SM in the present embodiment are extracted. FIG. 10 shows in detail the members constituting semiconductor module SM in the present embodiment such that a larger number of members are provided than in FIG. 9. Referring to FIGS. 9 and 10, a semiconductor module 201 of the present embodiment has a circuit configuration of semiconductor module SM in the circuit diagram of FIG. 1 as in the semiconductor module in each example of Embodiment 1. Since semiconductor module 201 of the present embodiment basically has components similar to those of semiconductor module 101 in the first example of Embodiment 1, the same components are denoted by the same references, and description thereof will not be repeated. However, semiconductor module 201 differs from semiconductor module 101 in the shape of each leadframe, which will be described below.

In the present embodiment, first leadframe 14 has a first surface and a second surface. The first surface is a surface on which first leadframe 14 and second leadframe 13 face each other, and the second surface is a surface on which first leadframe 14 and third leadframe 16 face each other. In the present embodiment, the first surface and the second surface cross each other. That is to say, the first surface and the second surface are directed in the opposite directions, for example, are orthogonal to each other. In this respect, the present embodiment differs in configuration from Embodiment 1 in which the first surface and the second surface are directed in the same direction.

Specifically, first leadframe 14 shown in FIG. 9 includes first longer extending portion 14c, first bent portion 14d, and first shorter extending portion 14e which are similar in shape to those of first leadframe 14 of FIG. 2, and first terminal portion 14a, first terminal hole 14b, and first vertically-longer extending portion 14f which are similar in shape to those of first leadframe 14 of FIG. 5. Third leadframe 16 shown in FIG. 9 includes third terminal portion 16a, third terminal hole 16b, third electrical connection 16e, and third vertically facing portion 16f which are similar in shape to those of third leadframe 16 of FIG. 5. In contrast, the first member of second leadframe 13 shown in FIG. 9 basically includes second facing portion 13d and second electrical connection 13e as in semiconductor module 101 in the first example of Embodiment 1.

Each leadframe of the present embodiment has a shape in which each leadframe of semiconductor module 101 in the first example of Embodiment 1 is combined with its corresponding leadframe of semiconductor module 102 in the second example of Embodiment 1. In first leadframe 14 and second leadframe 13, thus, the main surfaces of first longer extending portion 14c and second facing portion 13d face each other on the first surface extending along the XY plane as in semiconductor module 101. Contrastingly, in first leadframe 14 and third leadframe 16, the main surfaces of first vertically-longer extending portion 14f and third vertically facing portion 16f face each other on the second surface extending along the XZ plane as in semiconductor module 102. The first surface and the second surface are thus approximately orthogonal to each other.

Since the electrical connection of each leadframe with a corresponding one of first semiconductor element C1 and second semiconductor element C2 in semiconductor module 201 is similar to that of semiconductor module 101, description thereof will be omitted.

The function and effect of semiconductor module 201 in the present embodiment will now be described. Semiconductor module 201 achieves the following function and effect in addition to the effect of reducing parasitic inductance similarly to semiconductor module 101.

The first surface on which first leadframe 14 faces second leadframe 13 and the second surface on which first leadframe 14 faces third leadframe 16 are caused to differ from each other as in the present embodiment, resulting in a current path of second leadframe 13 which is shorter than that of Embodiment 1. Thus, the portion of second leadframe 13, which is a portion in which a parasitic inductance may occur, is smaller than that of Embodiment 1, and accordingly, the effect of reducing parasitic inductance can be expected to be enhanced further than in Embodiment 1.

In the present embodiment, all of first longer extending portion 14c of first leadframe 14, second facing portion 13d of second leadframe 13, and third vertically facing portion 16f of third leadframe 16 can be disposed to be in parallel with each other in the Y-direction. The length of first leadframe 14 which extends in the X-direction can thus be made smaller than that of Embodiment 1, leading to miniaturization of the entire semiconductor module 201.

In the present embodiment, further, first terminal portion 14a and third terminal portion 16a extend in the YZ-direction, and accordingly, the direction in which the screw runs can be made the X-direction as in semiconductor module 102, facilitating a screwing operation and a welding operation.

Embodiment 3

Figure 11:
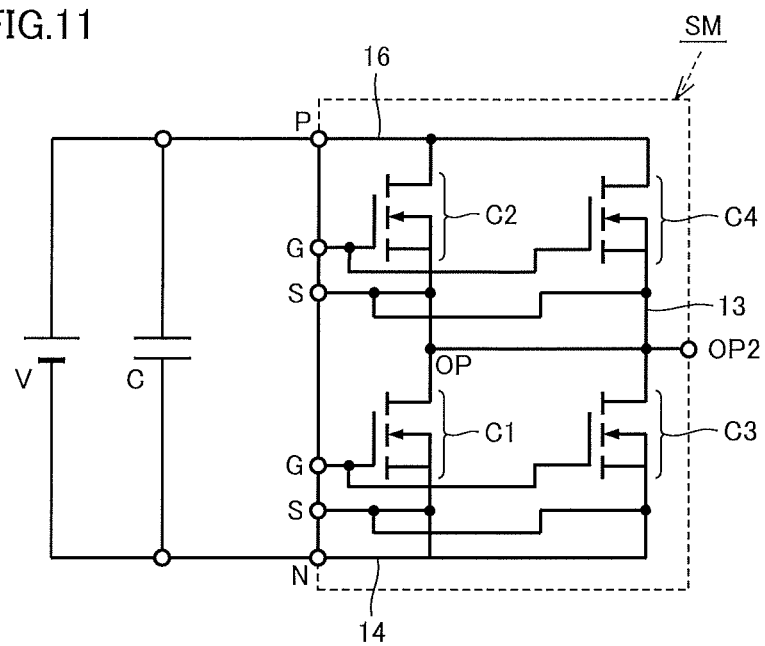
FIG. 11 is a circuit diagram showing a circuit configuration of a semiconductor module in a first example of Embodiment 3.
Figure 12:
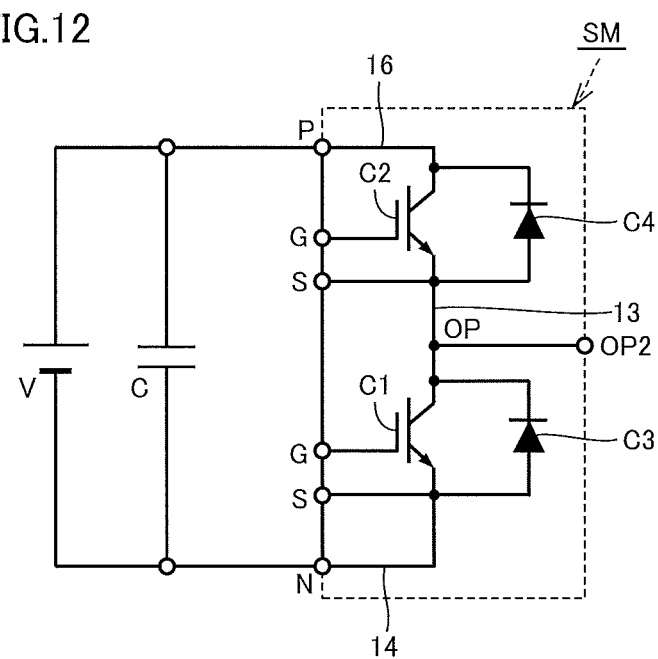
FIG. 12 is a circuit diagram showing a circuit configuration of a semiconductor module in a second example of Embodiment 3.

FIG. 11 shows a circuit configuration of semiconductor module SM in a first example of Embodiment 3. FIG. 12 shows a circuit configuration of semiconductor module SM in a second example of Embodiment 3. The circuit configurations in the first example and the second example of the present embodiment will be described first.

Referring to FIG. 11, since the circuit configuration of semiconductor module SM in the first example of the present embodiment is basically similar to the circuit configuration of semiconductor module SM in Embodiment 1 of FIG. 1, the same components are denoted by the same references, and description thereof will not be repeated. However, semiconductor module SM of the present embodiment differs from that of Embodiment 1 in that a plurality of semiconductor elements are connected in parallel in each arm.

In semiconductor module SM in the first example of the present embodiment, semiconductor elements, which constitute the lower arm interposed between first leadframe 14 and second leadframe 13, are first semiconductor element C1 and a third semiconductor element C3 connected in parallel. Also, in semiconductor module SM, semiconductor elements, which constitute the upper arm interposed between third leadframe 16 and second leadframe 13, are second semiconductor element C2 and a fourth semiconductor element C4 connected in parallel. Each of semiconductor elements C1 to C4 is preferably, for example, a MOSFET as in Embodiment 1. FIG. 11 shows an example in which two semiconductor elements are connected in parallel for each of the upper arm and the lower arm.

Referring to FIG. 12, though the circuit configuration of semiconductor module SM in the second example of the present embodiment is basically similar to that of FIG. 11, first semiconductor element C1 and second semiconductor element C2 are replaced with IGBTs, and third semiconductor element C3 and fourth semiconductor element C4 are replaced with freewheeling diodes. The above configuration may be provided, or a configuration in which an IGBT, a MOSFET, and a rectifier diode are appropriately combined with each other may be provided.

Figure 13:
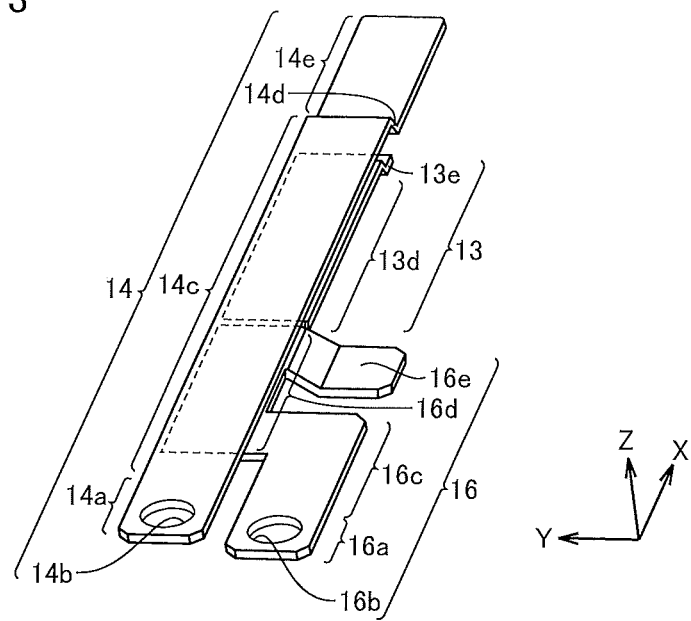
FIG. 13 is a schematic perspective view showing, in a simplified manner, a first example of part of a configuration in which the actual members of the semiconductor module shown in the circuit diagram of FIG. 11 or 12 are disposed.

FIG. 13 shows a first example in a state in which only some of the members constituting semiconductor module SM shown in the circuit diagram of FIG. 11 are extracted. Referring to FIG. 13, the leadframes constituting semiconductor module SM in the circuit diagram of FIG. 11 are shaped and face each other, that is, overlap each other as in the leadframes of semiconductor module 101 shown in FIG. 2. That is to say, each leadframe is a plate-shaped wiring path having a planar shape extending along the XY plane. However, first longer extending portion 14c, first shorter extending portion 14e, second facing portion 13d, and third facing portion 16d each extend longer in the X-direction in FIG. 13 than in FIG. 2. This results in a configuration in which a plurality of semiconductor elements can be connected in parallel in each arm.

Figure 14:
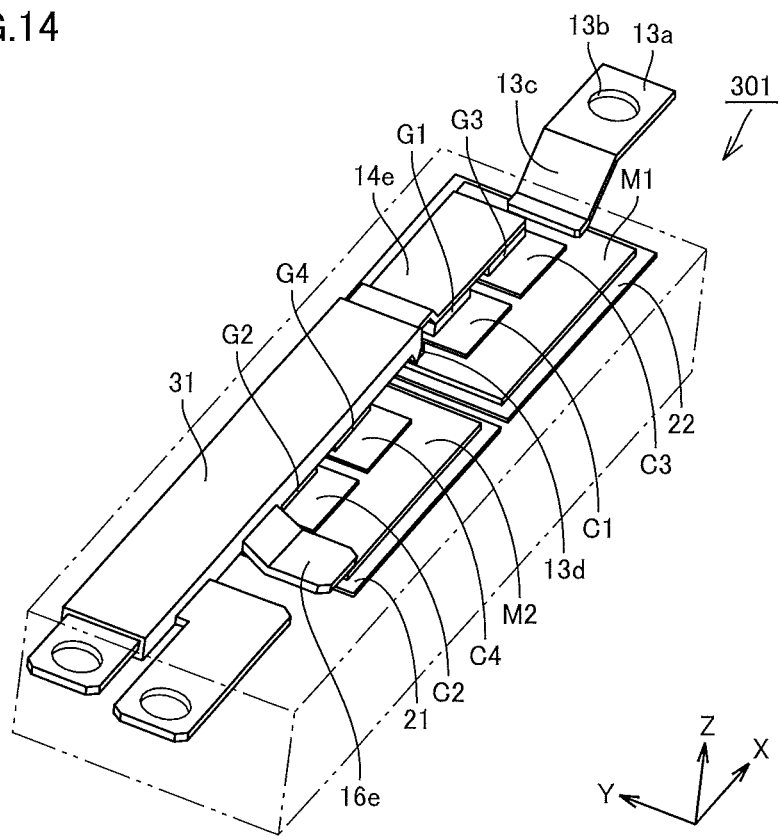
FIG. 14 is a schematic perspective view showing, in more detail than in FIG. 13, the first example in which the actual members of the semiconductor module shown in the circuit diagram of FIG. 11 or 12 are disposed.

FIG. 14 shows a first example showing in detail the members constituting semiconductor module SM shown in the circuit diagram of FIG. 11 such that a larger number of members are provided than in FIG. 13. Referring to FIGS. 13 and 14, since a semiconductor module 301 in the first example indicated by semiconductor module SM of FIG. 11 basically has a configuration similar to that of semiconductor module 101 of FIG. 3, the same components are denoted by the same references, and description thereof will not be repeated. In semiconductor module 301, however, first semiconductor element C1 and third semiconductor element C3 constituting the lower arm are connected in parallel with a spacing therebetween in the X-direction on the upper surface in the Z-direction of metal pattern M1 provided as in semiconductor module 101. Similarly in semiconductor module 301, second semiconductor element C2 and fourth semiconductor element C4 constituting the upper arm are connected in parallel with a spacing therebetween in the X-direction on the upper surface in the Z-direction of metal pattern M2 provided as in semiconductor module 101.

Referring to and comparing semiconductor module SM in the circuit diagram of FIG. 11 and semiconductor module 301 in the first example of the present embodiment of FIG. 14, first shorter extending portion 14e located at the end on the positive side in the X-direction of first leadframe 14 and first semiconductor element C1 are directly joined to each other with joint material G1 therebetween. First shorter extending portion 14e and third semiconductor element C3 are directly joined to each other with a joint material G3 therebetween. Thus, first leadframe 14 is electrically connected to first semiconductor element C1 and to third semiconductor element C3. Gate G of first semiconductor element C1 and gate G of third semiconductor element C3 are electrically connected to each other, and source S of first semiconductor element C1 and source S of third semiconductor element C3 are electrically connected to each other.

Second facing portion 13d located on the negative side in the X-direction of the first member of the two members of second leadframe 13 and second semiconductor element C2 are directly joined to each other with joint material G2 therebetween. Second facing portion 13d and fourth semiconductor element C4 are directly joined to each other with a joint material G4 therebetween. Consequently, first leadframe 14 is electrically connected to second semiconductor element C2 and to fourth semiconductor element C4. Gate G of second semiconductor element C2 and gate G of fourth semiconductor element C4 are electrically connected to each other, and source S of second semiconductor element C2 and source S of fourth semiconductor element C4 are electrically connected to each other.

Joint materials G3 and G4 described above are made of, for example, solder as in joint materials G1 and G2. Each of the end of second bent portion 13c and second electrical connection 13e is electrically connected to metal pattern M1 by connection method A. Third electrical connection 16e is electrically connected to metal pattern M2 by connection method A.

Also in the present embodiment, first leadframe 14 and second leadframe 13 are sealed to be integrated with each other by insulating material 31. Consequently, insulating material 31 of semiconductor module 301 in FIG. 14 runs longer in the X-direction than insulating material 31 of semiconductor module 101 in FIG. 3.

As in semiconductor module 301 of FIGS. 13 and 14, extending each leadframe long in the X-direction can form the circuit of semiconductor module SM in FIG. 11 irrespective of the number of chips of a semiconductor element.

Figure 15:
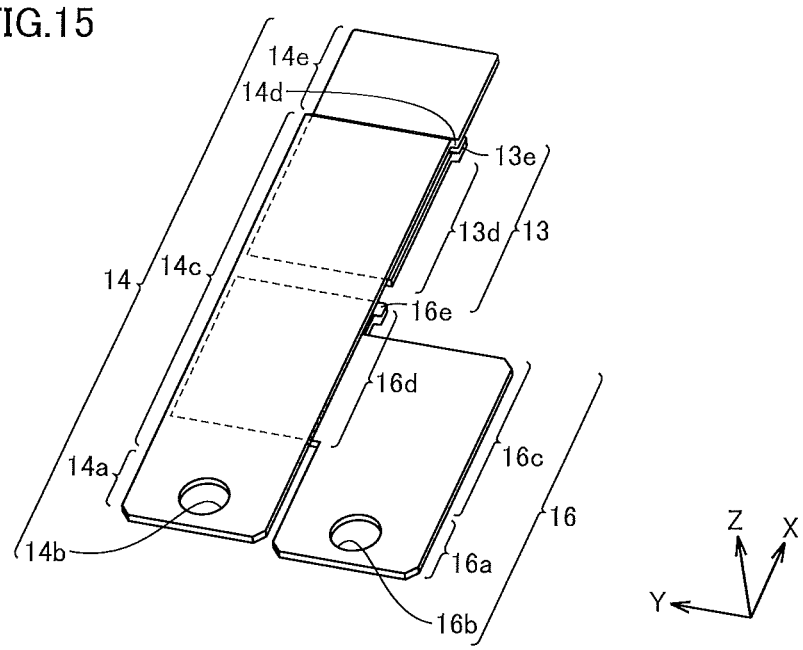
FIG. 15 is a schematic perspective view showing, in a simplified manner, a second example of part of the configuration in which the actual members of the semiconductor module shown in the circuit diagram of FIG. 11 or 12 are disposed.

FIG. 15 shows a second example of the state in which only some of the members constituting semiconductor module SM shown in the circuit diagram of FIG. 11 are extracted. Referring to FIG. 15, each leadframe in the second example basically has, for example, a shape similar to that of the first example shown in FIG. 13. However, each of first leadframe 14, second leadframe 13, and third leadframe 16 has a greater width in the Y-direction and a smaller length in the X-direction in FIG. 15 than in FIG. 13. In FIG. 15, the greater width in the Y-direction results in a configuration in which a plurality of semiconductor elements can be connected in parallel in each arm.

Figure 16:
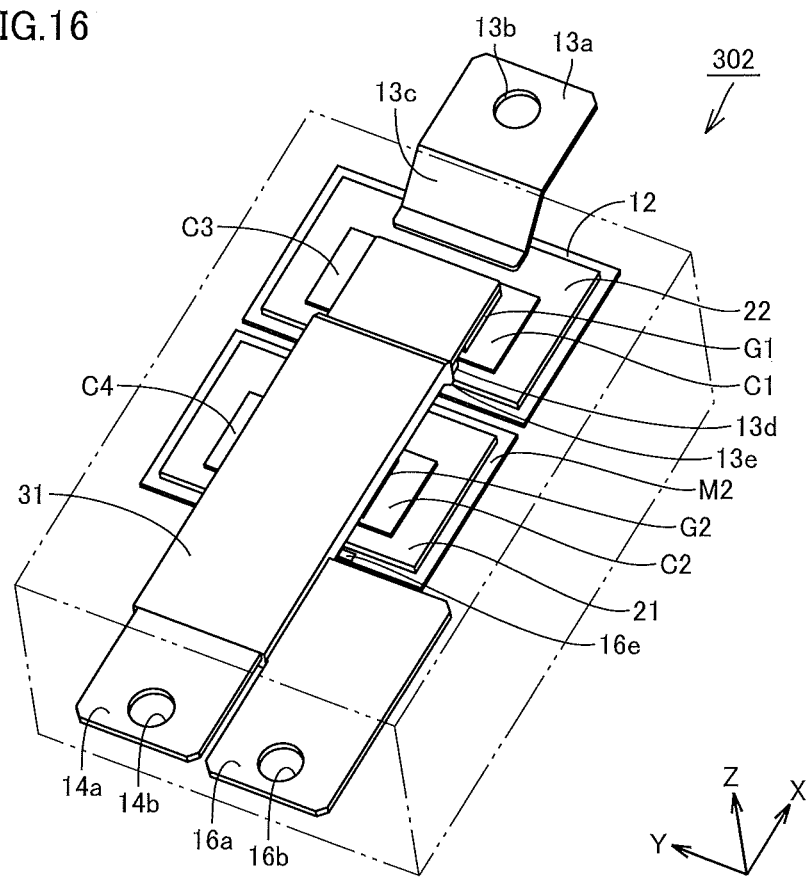
FIG. 16 is a schematic perspective view showing, in more detail than in FIG. 15, the second example of the configuration in which the actual members of the semiconductor module shown in the circuit diagram of FIG. 11 or 12 are disposed.

FIG. 16 shows a second example showing in detail the members constituting semiconductor module SM shown in the circuit diagram of FIG. 11 such that a larger number of members are provided than in FIG. 15. Referring to FIGS. 15 and 16, since a semiconductor module 302 of the second example indicated by semiconductor module SM of FIG. 11 basically has components similar to those of semiconductor module 301 of FIG. 3, the same components are denoted by the same references, and description thereof will not be repeated. In semiconductor module 302, however, first semiconductor element C1 and third semiconductor element C3 constituting the lower arm are connected in parallel with a spacing therebetween in the Y-direction on the upper surface in the Z-direction of metal pattern M1 provided as in semiconductor module 301. Similarly in semiconductor module 302, second semiconductor element C2 and fourth semiconductor element C4 constituting the upper arm are connected in parallel with a spacing therebetween in the Y-direction on the upper surface in the Z-direction of metal pattern M2 provided as in semiconductor module 301. In this respect, semiconductor module 302 differs in configuration from semiconductor module 301 in which a plurality of semiconductor elements constituting the upper arm and a plurality of semiconductor elements constituting the lower arm are connected in parallel with a spacing therebetween in the X-direction.

Extending a plurality of semiconductor elements, which constitute each arm, long in the Y-direction can make the path lengths of current paths RN and RP, each passing through individual semiconductor elements constituting a corresponding one of the arms, approximately equal to each other as in semiconductor module 302 of FIGS. 15 and 16. This can reduce the difference in the amount of current between the current paths each passing through the respective semiconductor elements constituting the corresponding one of the arms.

Extending leadframes, which extend along the XY plane, in the Y-direction as in semiconductor module 302 of FIGS. 15 and 16 can constitute the circuit of semiconductor module SM of FIG. 11 irrespective of the number of chips of a semiconductor element.

Although not shown, a semiconductor module having a configuration, in which semiconductor module 301 of FIG. 14 and semiconductor module 302 of FIG. 16 are combined with each other, may be formed.

Although FIGS. 13 to 16 show the example of semiconductor module SM in the circuit diagram of FIG. 11, semiconductor module SM in the circuit diagram of FIG. 12 can also be formed as shown in FIGS. 13 to 16. Also in this case, the IGBT and the freewheeling diode are vertical diodes and have electrodes on the rear surfaces of the chips. Thus, first semiconductor element C1 and third semiconductor element C3 are electrically connected to metal pattern M1, and second semiconductor element C2 and fourth semiconductor element C4 are electrically connected to metal pattern M2. Consequently, second electrical connection 13e and second bent portion 13c are electrically connected to first semiconductor element C1 and third semiconductor element C3, and third electrical connection 16e is electrically connected to second semiconductor element C2 and fourth semiconductor element C4.

Embodiment 4

In the present embodiment, semiconductor devices according to Embodiments 1 to 3 are used in a power converter. Although the present invention is not limited to a specific power converter, the case in which the present invention is applied to a three-phase inverter will be described below as Embodiment 4.

Figure 17:
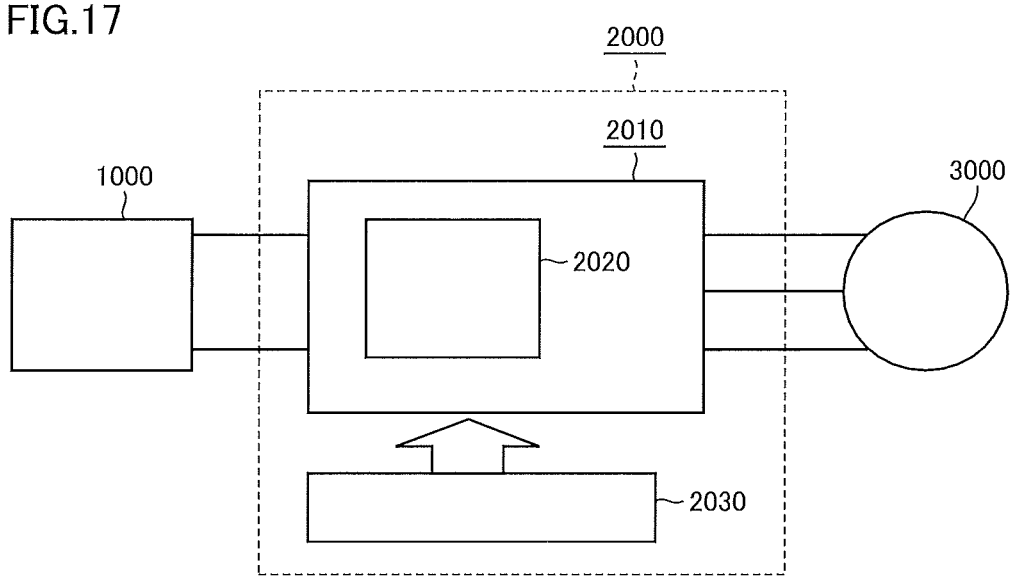
FIG. 17 is a block diagram showing a configuration of a power conversion system to which a power converter according to Embodiment 4 is used.

FIG. 17 is a block diagram showing a configuration of a power conversion system in which the power converter according to the present embodiment is used. The power conversion system shown in FIG. 17 includes a power supply 1000, a power converter 2000, and a load 3000. Power supply 1000 is a DC power supply and supplies DC power to power converter 2000. Power supply 1000 may be configured as any of various components. For example, power supply 1000 may be configured as a DC system, a solar cell, or a storage battery, or may be configured as a rectifier circuit or an AC/DC converter connected to an AC system. Alternatively, power supply 1000 may be configured as a DC/DC converter that converts DC power output from the DC system into predetermined power.

Power converter 2000 is a three-phase inverter connected between power supply 1000 and load 3000. Power converter 2000 converts DC power supplied from power supply 1000 into AC power and supplies the AC power to load 3000. Power converter 2000 includes a main conversion circuit 2010 that converts input DC power into AC power and outputs the AC power, and a control circuit 2030 that outputs a control signal for controlling main conversion circuit 2010 to main conversion circuit 2010 as shown in FIG. 17.

Load 3000 is a three-phase electric motor driven by the AC power supplied from power converter 2000. Load 3000 is not limited to a particular use and is an electric motor mounted in various types of electrical devices, which can be used as an electric motor for a hybrid vehicle, electric vehicle, rail vehicle, elevator, or air conditioner.

Details of power converter 2000 will be described below. Main conversion circuit 2010 includes a switching element (not shown) and a freewheeling diode (not shown). As a result of switching of the switching element, main conversion circuit 2010 converts the DC power supplied from power supply 1000 into AC power and supplies the AC power to load 3000. Although specific circuit configurations of main conversion circuit 2010 are of various types, main conversion circuit 2010 according to the present embodiment is a two-level, three-phase full-bridge circuit, and can be composed of six switching elements and six freewheeling diodes each connected in anti-parallel with a corresponding one of the six switching elements. At least any of the switching elements and the freewheeling diodes of main conversion circuit 2010 is formed of semiconductor module 2020 corresponding to semiconductor module SM in any one of Embodiments 1 to 3. The six switching elements are connected in series for every two switching elements to constitute upper and lower arms, and the upper and lower arms constitute each phase (U-phase, V-phase, W-phase) of the full-bridge circuit. The respective output terminals of the upper and lower arms, that is, three output terminals of main conversion circuit 2010 are connected to load 3000.

Main conversion circuit 2010 includes a drive circuit (not shown) that drives at least any of the switching elements and the freewheeling diodes (which will be referred to as (each) switching element" below). Alternatively, the drive circuit may be built in semiconductor module 2020, or the drive circuit may be provided separately from semiconductor module 2020. The drive circuit generates a drive signal for driving the switching element of main conversion circuit 2010 and supplies the drive signal to a control electrode of the switching element of main conversion circuit 2010. Specifically, the drive circuit outputs a drive signal for turning on the switching element and a drive signal for turning off the switching element to the control electrode of each switching element in accordance with the control signal from control circuit 2030. When the switching element is kept on, the drive signal is a voltage signal (ON signal) equal to or higher than the threshold voltage of the switching element, and when the switching element is kept off, the drive signal is a voltage signal (off signal) equal to or lower than the threshold of the switching element.

Control circuit 2030 controls the switching element of main conversion circuit 2010 such that a desired amount of power is supplied to load 3000. Specifically, based on the power to be supplied to load 3000, control circuit 2030 calculates a period of time (on time) in which each switching element of main conversion circuit 2010 is to be turned on. For example, main conversion circuit 2010 can be controlled through PWM control in which the on time of the switching element is modulated in accordance with the voltage to be output. Then, control circuit 2030 outputs a control command (control signal) to the drive circuit of main conversion circuit 2010 such that the on signal is output to the switching element to be turned on and the off signal is output to the switching element to be turned off at each point of time. The drive circuit outputs the on signal or off signal as a drive signal to the control electrode of each switching element in accordance with the control signal.

Since the power modules according to Embodiments 1 to 3 are used as the switching elements and freewheeling diodes of main conversion circuit 2010 in the power converter according to the present embodiment, an effect of restraining a parasitic inductance or any other effect can be achieved.

Although the present embodiment has described the example in which the present invention is applied to a two-level three-phase inverter, the present invention is not limited thereto and is applicable to various power converters. Although a two-level power converter is used in the present embodiment, a three-level or multilevel power converter may be used, or the present invention is applicable to a single-phase inverter when power is supplied to a single-phase load. Alternatively, when power is supplied to a DC load or the like, the present invention is applicable to a DC/DC converter or an AC/DC converter.

The power converter to which the present invention is applied is not limited to the case in which the load described above is an electric motor as described above, and can be used as a power supply device of an electric discharge machine or a laser beam machine, or a dielectric heating utensil or a non-contact power feed system, and further, can be used as a power conditioner of a photovoltaic power generation system, a power storage system, or any other system.

The features described in (the examples of) the respective embodiments described above can be applied in appropriate combination within the range where technical inconsistency does not occur.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST 13 second leadframe, 13a second terminal portion, 13b second terminal hole, 13c second bent portion, 13d second facing portion, 13e second electrical connection, 13f second vertically facing portion, 13g second horizontally-longer extending portion, 13h second horizontally-shorter extending portion, 14 first leadframe, 14a first terminal portion, 14b first terminal hole, 14c first longer extending portion, 14d first bent portion, 14e first shorter extending portion, 14f first vertically-longer extending portion, 14g first horizontally-longer extending portion, 16 third leadframe, 16a third terminal portion, 16b third terminal hole, 16c third longer extending portion, 16d third facing portion, 16e, 16g third electrical connection, 16f third vertically facing portion, 21, 22 ceramic plate, 31 insulating material, 32 sealing material, 101, 102, 103, 201, 301, 302, SM semiconductor module, C1 first semiconductor element, C2 second semiconductor element, G1, G2, G3, G4 joint material, M1, M2 metal pattern.

The invention claimed is:

1. A semiconductor module comprising:
a first leadframe as a plate-shaped wiring path to which a first potential is applied;
a second leadframe as a plate-shaped wiring path including an output terminal;
a third leadframe as a plate-shaped wiring path to which a second potential different from the first potential is applied;
an insulating material sealing the first and second leadframes to integrate the first and second leadframes with each other;
a first semiconductor element directly joined to the first leadframe with a joint material therebetween; and
a second semiconductor element directly joined to the second leadframe with a joint material therebetween, wherein
the second leadframe and the third leadframe face an identical surface of the first leadframe while being arranged side by side as viewed in plan view, and
the first leadframe and the second leadframe face each other with the insulating material therebetween.

2. The semiconductor module according to claim 1, wherein the third leadframe is electrically connected to a positive side of a smoothing capacitor provided externally.

3. The semiconductor module according to claim 1, wherein
the third leadframe is sealed with the insulating material to be integrated with the first and second leadframes, and
the third leadframe faces the first leadframe with the insulating material therebetween.

4. The semiconductor module according to claim 1, wherein
the joint material is solder,
the insulating material is a resin material, and
the resin material has a melting point higher than a melting point of the solder.

5. The semiconductor module according to claim 1, further comprising a sealing material sealing at least part of the first leadframe, at least part of the second leadframe, at least part of the third leadframe, the insulating material, and the first and second semiconductor elements, and
the sealing material is made of a material different from the insulating material.

6. A power converter comprising:
a main conversion circuit to convert input power and output the converted power, the main conversion circuit including the semiconductor module according to claim 1; and
a control circuit to output a control signal for controlling the main conversion circuit.

7. A semiconductor module comprising:
a first leadframe as a plate-shaped wiring path to which a first potential is applied;

a second leadframe as a plate-shaped wiring path including an output terminal;

a third leadframe as a plate-shaped wiring path to which a second potential different from the first potential is applied;

an insulating material sealing the first and second leadframes to integrate the first and second leadframes with each other;

a first semiconductor element directly joined to the first leadframe with a joining member therebetween; and a second semiconductor element directly joined to the second leadframe with a joining member therebetween, wherein the second leadframe and the third leadframe face an identical surface of the first leadframe, the first leadframe and the second leadframe face each other with the insulating material therebetween, the third leadframe is sealed with the insulating material to be integrated with the first and second leadframes, the third leadframe faces the first leadframe with the insulating material therebetween, the first leadframe includes:

a first surface facing the second leadframe, and a second surface facing the third leadframe, and the first surface and the second surface cross each other.

8. The semiconductor module according to claim 7, wherein the joint material is solder, the insulating material is a resin material, and the resin material has a melting point higher than a melting point of the solder.

9. The semiconductor module according to claim 7, further comprising a sealing material sealing at least part of the first leadframe, at least part of the second leadframe, at least part of the third leadframe, the insulating material, and the first and second semiconductor elements, and the sealing material is made of a material different from the insulating material.

10. A power converter comprising:

a main conversion circuit to convert input power and output the converted power, the main conversion circuit including the semiconductor module according to claim 7; and a control circuit to output a control signal for controlling the main conversion.

* * * * *